United States Patent [19]

Rosenfeld et al.

[11] Patent Number: 5,156,720
[45] Date of Patent: Oct. 20, 1992

[54] PROCESS FOR PRODUCING RELEASED VAPOR DEPOSITED FILMS AND PRODUCT PRODUCED THEREBY

[75] Inventors: Aron M. Rosenfeld; Paul Smits, both of Ontario, Canada

[73] Assignee: Alcan International Limited, Montreal, Canada

[21] Appl. No.: 306,505

[22] Filed: Feb. 3, 1989

[51] Int. Cl.⁵ .............................. C25D 11/26
[52] U.S. Cl. ...................... 205/76; 156/233; 156/234; 156/235; 156/237; 156/238; 428/469; 428/472.1; 205/77; 205/118; 205/138; 205/175; 205/200
[58] Field of Search .......... 204/37.6, 38.3, 42, 204/25; 156/233, 234, 235, 237, 238; 428/469

[56] References Cited

U.S. PATENT DOCUMENTS

| | | | |
|---|---|---|---|
| 841,321 | 1/1907 | Howard | 428/915 X |
| 2,360,325 | 10/1944 | Higbee | 428/915 X |
| 4,082,873 | 4/1978 | Williams | 428/915 X |
| 4,098,940 | 7/1978 | Groh et al. | 428/915 X |
| 4,190,315 | 2/1980 | Brettle et al. | 350/9.2 |
| 4,322,466 | 3/1982 | Tomlinson | 428/915 X |
| 4,424,911 | 1/1984 | Resuick | 428/916 |
| 4,434,010 | 2/1984 | Ash | 106/291 |
| 4,480,760 | 11/1984 | Schouberger | 215/230 |
| 4,489,841 | 12/1984 | Thompson | 215/230 |
| 4,502,605 | 3/1985 | Wloszczyan | 215/230 |
| 4,511,052 | 4/1985 | Howard | 215/230 |
| 4,516,679 | 5/1985 | Simpson et al. | 428/916 |
| 4,519,515 | 5/1985 | Schouberger | 215/230 |
| 4,557,505 | 12/1985 | Schaefer et al. | 428/916 |
| 4,591,062 | 5/1986 | Sandhaus | 215/230 |
| 4,657,573 | 4/1987 | Williams | 428/915 |
| 4,662,653 | 5/1987 | Greenaway | 428/915 X |
| 4,705,300 | 11/1987 | Benning et al. | 283/91 |
| 4,721,217 | 11/1988 | Phillips et al. | 283/91 |

FOREIGN PATENT DOCUMENTS 0227423 7/1987 European Pat. Off. .

OTHER PUBLICATIONS

The optical properties of thin oxide films on tantalum—Charlesby et al.-Proc. Royal Society A 227 (1955) 434,443.
Anodizing the Reactive Metals–Seeley–Metal Finishing Aug. 1986.
Metallurgy of the rarer metals–6 Tantalum, Niobium G. L. Miller-Butterworth Scientific Publications London 1959.
The Coloration of Refractory Metals–James B. Ward–American Metal Smith.
L. Young, 1957, Transactions Faraday Society 58, 841.
W. E. Hillig cited in D.A. Vermilyea, 1957, J. Electrochemical Society 104, 485.

(List continued on next page.)

Primary Examiner—John F. Niebling
Assistant Examiner—William T. Leader
Attorney, Agent, or Firm—Cooper & Dunham

[57] ABSTRACT

A process for producing a released film made of at least two layers, one or more of which has been formed by a vapor deposition technique. The process involves anodizing a metal substrate comprising a valve metal or valve metal alloy to form an anodic oxide layer on the substrate, the anodization being carried out in the presence of an adhesion-reducing agent (e.g. fluoride) which makes the anodic layer detachable from the valve metal, coating the anodic layer with one or more layers of desired materials by a vapor deposition technique (e.g. sputtering or vacuum evaporation, etc.) to form a film of desired structure which is releasable from the metal substrate, and then detaching the releasable film from the metal substrate. The film can, if desired, be transferred to another substrate by attaching the other substrate to the releasable film before the releasable film is detached from the metal substrate. The process makes it possible to provide free-standing vapor deposited films or heat-sensitive (or other) substrates coated with such films.

29 Claims, 3 Drawing Sheets

OTHER PUBLICATIONS

L. Young, 1957, Transactions Faraday Soc. #58, p. 841.
W. E. Hillig cited in D. A. Virmilypa, 1957, J. Electrochemical Soc., #104 p. 485.
R. E. Powel et al., 1964, J. Applied Physics #35, p. 435.
A. Aladjem et al. 1969 J. Vacuum Science and Technology #6 p. 635.
The Optical Props. of Thin Oxide Films on Ti; Charlesby et al., Proc. Royal Soc. 227 (1955) pp. 434-442.
Anodizing Reactive Metals; Seely, Metal Finishing Aug. 1986.
Metallurgy of the Rarer Metals; G. L. Miller, Butterworth Sci. Pub. London, 1959.
The Condition of Refractory Metals; J. B. Ward, American Metal Smith.
R. E. Powel et al., 1972 J. Electro Chemical Soc. #119 p. 25.
B. Maurel et al. 1972, J. Electrochemical Soc. #119 p. 1715.
Pawel & Lundy-A Submicron Sectioning Technique for Analyzing Diffusion Specimens of Tantalum and Niobium-J. of Applied Physics-Feb. 1961.
Aladjem & Brandon-J. of Vacuum Science & Technology, vol. 6, No. 4.
Pawel et al.-J. Electrochem. Soc. Jan. 1972.
Maurel et al. J. Electrochem. Soc. Dec. 1972.
Young-Anodic Oxide Films-Sep. 1956.
Baun-Anodization of Evaporated Aluminium on Ti-6 wt % Al-4 wt % V. J. of Materials Science 15 (1980) 2749-2753.
Yaniv & Klein-Corrosion Science, 1971, vol. 11, pp. 343-352.
Hunter-Physics of Thin Films, vol. 7, Academic Press, 1973, pp. 43-114.
Vermilyea-Annealing Anodic $TA_2O_5$ Films-J. of Electrochemical Society Aug. 1957.

PROCESS FOR PRODUCING RELEASED VAPOR DEPOSITED FILMS AND PRODUCT PRODUCED THEREBY

BACKGROUND OF THE INVENTION

I. Field Of The Invention

This invention relates to a process for producing released films comprising layers formed by vapour deposition techniques, to the released films so produced, and to substrates coated with the released films by a transfer process.

II. Description Of The Prior Art

In thin film technology, methods to release films from the substrates on which they have been formed are of widespread interest. These may be used, for example, to obtain free-standing films such as metal foils. Another common application is to realize a given coating on a specific substrate that is incompatible with the desired deposition process for that coating; this is based on a transfer process in which the coating is first deposited onto a compatible substrate, the coated substrate is then bonded to the substrate of interest following which the original substrate is removed, thus releasing the coating from the original substrate and transferring it to the substrate of interest. By incompatible substrate, we mean one that would be adversely affected by the deposition process, or conversely, one that would have an adverse effect on the deposition conditions or equipment. In the case of vapour deposition techniques, an example of the former is a thermally sensitive plastic substrate that would be degraded by heat generated in the deposition process. An example of the latter is a paper substrate that would generate such a water vapour outgassing load that required operating conditions in vacuum deposition processes could not be achieved.

Several such release techniques are well known in the art of thin film deposition using vapour processes such as sputtering, evaporation and chemical vapour deposition. One technique is the use of particular substrate materials or coated substrates to which the film of interest is only weakly adhering and from which it may be peeled; examples of these include polytetrafluoroethylene, polytetrafluoroethylene-coated materials, and highly polished stainless steel. A second technique is the use of a parting layer deposited onto the substrate prior to deposition of the film of interest; the parting layer is dissolved in from the edges of the sample to release the film. Many usable parting layer materials are known including inorganic materials such as sodium chloride and calcium fluoride which are deposited by evaporation and are soluble in water, as well organic films such as cellulose acetate deposited by casting and which is soluble in amyl acetate. These and other parting layers are discussed for example in the review article 'The Preparation and Use of Unbacked Metal Films as Filters in the Extreme Ultraviolet' by W.R. Hunter in the monograph 'Physics of Thin Films', Volume 7, Academic Press, 1973, p. 43. A third release technique is simply to deposit the film of interest onto a substrate that can be completely dissolved away. The use of thin plastic sheet for this purpose is disclosed in U.S. Pat. No. 4,434,010 issued on Feb. 28, 1984 to Optical Coating Laboratory Inc.

Each of these techniques is useful in specific applications but all have disadvantages that limit their effectiveness or general applicability. They may themselves involve heat-sensitive or outgassing materials (organic parting layers), have specific crystallinity or surface roughness that may impose undesired growth modes on the film of interest (sodium chloride parting layer), involve solvents that may attack the film of interest or the substrate to which it is transferred, or require excessive dissolution times as in the above cited patent. These constraints are particularly significant in the field of optical coatings where dielectric films on plastic substrates are of interest. These typically involve oxide materials evaporated at high temperature due to their high melting points as well as other materials such as magnesium fluoride that needs to be deposited at a substrate temperature in excess of 200° C. to secure good film properties.

Accordingly there is a need for release technologies to be used with vapour deposition processes, that do not require a dissolution step, and are based on materials that are inert and thermally stable over the range of operating conditions for these processes, and provide a smooth, homogeneous and amorphous surface for deposition.

OBJECTS OF THE INVENTION

An object of the invention is to provide a process for producing released films that satisfies some or all of the above requirements.

SUMMARY OF THE INVENTION

According to the invention there is provided a process for producing a released film made of a plurality of layers of material, at least one of which has been formed by a vapour deposition technique, said process comprising: providing a metal substrate made of a material selected from the group consisting of a valve metal and an anodizable valve metal alloy, at least at an exposed surface thereof; subjecting said metal substrate to anodization at said exposed surface to form an anodic layer of an oxide of said valve metal, said anodization being carried out, at least in limited areas of said surface, in the presence of an adhesion-reducing agent in order to make said layer readily detachable from said substrate at least in said limited areas; coating said anodic layer with at least one layer of material by a vapour deposition process to form a releasable film of desired structure; and detaching said releasable film from said metal substrate.

By the term "released film" we mean a film that is detached from a substrate on which it was originally fabricated either to form a free-standing film or to form a coating on another substrate.

By the term "releasable film" we mean a film that is detachable from a substrate on which it was originally fabricated.

By the term "vapour deposition process" we mean processes, such as sputtering, electron beam evaporation and low pressure chemical vapour deposition, that are carried out in evacuated chambers and involve the generation of heat during the process.

Figure 1A:
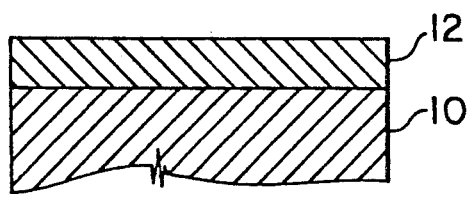
FIGS. 1(A)-1(E) are cross-sections showing the structures resulting from various steps in a preferred embodiment of the process of the present invention.

The relative thicknesses of various layers shown in the drawings are not intended to be to scale.

DETAILED DESCRIPTION OF THE INVENTION AND THE PREFERRED EMBODIMENTS

In the present invention, releasable films are first fabricated on particular metal substrates. Such metal substrates are compatible with vapour deposition processes because they themselves are not damaged or deformed by heat. Moreover, the metal substrate acts as a "heat sink", its high conductivity and heat capacity causing heat from a depositing layer to be drawn away to the metal substrate, thus minimizing deformation and damage within the film itself. While vapour deposition has previously been used for coating metals, the resulting coating layers were not normally detachable from the substrate. In the present invention, the coating is made releasable by first forming a detachable valve metal oxide layer on the metal substrate and then vapour depositing layers of desired materials on the oxide layer. Anodic oxide layers normally adhere tenaciously to the metals on which they are formed, but such layers can be made readily and uniformly detachable if the anodization is carried out in the presence of an adhesion-reducing agent.

The releasable film can be removed intact by attaching a suitable material to the exposed outer surface of the film and then peeling the material and attached film from the metal substrate (or vice versa if the metal substrate is flexible). If it is desired to coat a second substrate with the released film, then the material used for detachment of the film can be the second substrate or an intermediate substrate by which the film is subsequently transferred to form the final product. If an extensive free-standing released film is required, the releasable film can first be detached from the metal substrate by attachment of the suitable material and peeling, followed by removal of the material from the released film, i.e. by dissolving, oxidizing or decomposing the material. If the film is desired in the form of small flakes or particles, the releasable film can be removed directly from the metal substrate, e.g. by scraping, abrasion, scratching or the like.

The metals which are susceptible to the adhesion-reducing effect when anodized are the valve metals, e.g. Ta, Nb, Zr, Hf, Ti etc. and alloys containing these metals (e.g. alloys with Al or alloys of two or more of the valve metals themselves). Tantalum and niobium are particularly preferred. These metals and alloys form barrier oxide films when anodized in suitable electrolytes. Normally, the thickness of the anodic film depends on the voltage employed during the anodization step, with thicker films being formed at higher voltages. If the anodic film is required only for its release properties, low voltages may be employed (e.g. up to about 30 V) but if the anodic film is required for its inherent properties, then higher voltages normally up to about 300 V may be chosen in order to form thicker films. The techniques of anodizing valve metals to form barrier oxide films are well known to persons skilled in the art, e.g. as described by L. Young in the monograph in "Anodic Oxide Films", Academic Press, 1961, the disclosure of which is incorporated herein by reference. The anodization takes place very quickly and normally takes only seconds or minutes. The procedure is normally carried out at ambient temperature.

The adhesion-reducing agents are ions which, when present during the anodization step, weaken the adhesion between the growing anodic film and the underlying valve metal. The most preferred adhesion-reducing agent is fluoride which may be introduced in the form of a simple salt, e.g. NaF and KF, or in the form of complex salts, fluorine-containing compounds or acids, e.g. hydrofluoric acid or fluoroboric acid. The agent may be added to the electrolyte or coated on the surface of the valve metal prior to the anodization step. Generally, quite small amounts of the adhesion-reducing agent are required; for example, when the agent is fluoride, the amount can be as low as about 0.005% by volume (more preferably at least 0.05% by volume) of the electrolyte. However, the desired levels in any particular case can be determined by simple trial and experimentation.

If desired, some limited areas of the anodic layer may be made detachable whereas the remaining areas may be non-detachable. This can be achieved by exposing only the desired detachable areas to the adhesion-reducing agent during the anodization step, e.g. by masking the non-detachable areas, carrying out an initial anodization in the presence of the adhesion-reducing agent, removing the mask, and then re-anodizing in an electrolyte containing no adhesion-reducing agent. This allows the releasable film to be made in a particular pattern or shape, which may be desirable for certain applications.

Since valve metals are usually quite expensive, the metal substrate is normally made up of foil, sheet or plate of an inexpensive co-anodizable metal (e.g. aluminum) having a thin coating of the valve metal on one surface. The valve metal layer can be formed by any suitable technique, e.g. sputtering, evaporation etc., and need only be very thin, although the thickness should be great enough to avoid complete consumption of the metal during anodization. Generally the layer thickness should be at least 250 Å. As an example, a 300Å coating of Ta can be deposited on an aluminum foil at speeds in the order of 50 feet per minute by a vacuum sputtering procedure. If desired, however, the metal substrate may be made entirely of the valve metal or alloy in the form of a foil, sheet, plate etc. This becomes economical if the valve metal is used repeatedly as a substrate for the film deposition.

When the anodic layer has been formed, at least one additional layer is deposited onto the anodic layer. For example, materials such as oxides, nitrides, carbides or metals can be deposited by vapour deposition techniques. These deposition methods can be operated at high speeds because the anodized metals can sustain higher temperatures than, for example, a plastic substrate, and the heat is quickly conducted through the coating by the underlying metal substrate. As many different layers as desired can be formed in this way.

When the resulting releasable film is detached from the metal substrate by adhering a material to the outer surface and peeling, the resulting released film forms a coating on the material having an order of layers inverse to that in which the layers were formed and having a valve metal oxide layer at the outermost surface. The material attached to the released film may be flexible or relatively inflexible (in which case the metal substrate should be flexible to facilitate peeling) and may be attached directly to the releasable film prior to its detachment (e.g. by heat sealing) or indirectly via glue or adhesive. This material is normally one which is itself incompatible with vapour deposition techniques, e.g. low melting point polymers, paper, textiles, wood, etc. and/or one which can be readily removed from the released film, e.g. a soluble polymer (such as polyvinyl alcohol) or one which can be oxidized or decomposed by irradiation etc. Since the attachment of the material to the releasable film can be carried out by a variety of methods, many materials can be used for the detachment of the releasable film, and hence can be coated with the release film. Heat sealable polymers (e.g. polyester and polypropylene) which can be adhered to the release film at temperatures between 50°-150° C. are particularly useful. The material is normally in the form of a flat sheet, but shaped or contoured structures could alternatively be employed, provided the releasable film and substrate metal could be made to conform to the adhering surface of the material.

Once the releasable film has been attached to the material and detached from the substrate metal, the outermost layer of valve metal oxide can, if desired, be covered with one or more layers of additional material by any technique that does not cause damage, distortion or outgassing from the coated material. For example, if a metal coating is desired, this can be achieved by D.C. magnetron sputtering, which can be carried out at a fairly high rate without damage (in contrast to RF sputtering of oxides), or by electroless plating.

The accompanying drawings show various steps in preferred embodiments of the process of the invention and the resulting structures.

Figure 1B:
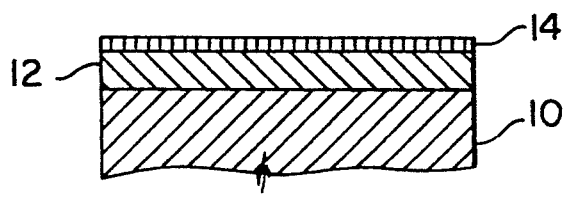
Figure 1C:
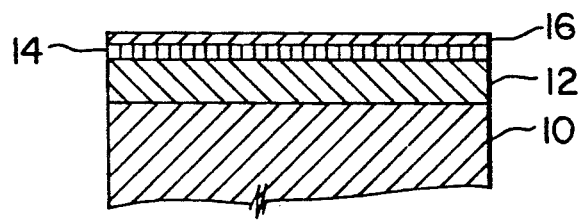
Figure 1D:
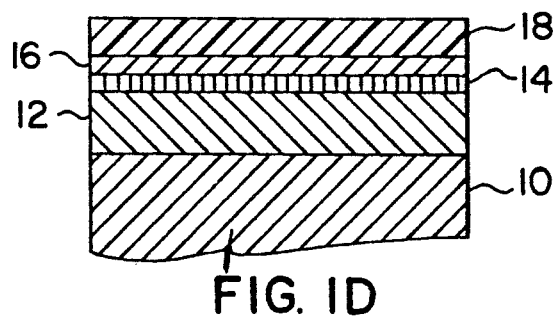
Figure 1E:
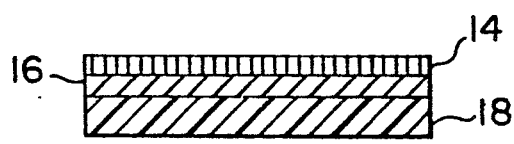

FIG. 1(A) shows an initial structure comprising a heavy aluminum web 10 having a thin Ta coating 12. FIG. 1(B) shows the same structure following anodization of the Ta in an electrolyte containing an adhesion-reducing agent (e.g. NaF). A loosely-adhering anodic layer 14 is formed on the Ta surface. In FIG. 1(C) the anodic layer has been coated by sputtering with a film 16 of interest (with a layer 16 of oxide, for example). As shown in FIG. 1(D) the resulting structure is then coated with a polymer substrate 18, preferably by a low temperature heat sealing technique. Fig. 1(E) shows the coated polymer substrate following detachment from the metal (10 and 12) and inversion.

Figure 2:
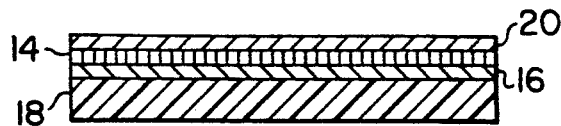
FIG. 2 shows coated products produced by modifications of the procedure shown in FIG. 1.

FIG. 2 shows the same structure of FIG. 1(E) except that an additional coating 20 has been applied to the tantalum oxide layer 14 by D.C. magnetron sputtering or electroless plating, for example.

The present invention, especially when Ta is used as the valve metal, is particularly suited to the production of optical multilayer films which exhibit desirable optical effects and which for many applications are supported on a plastic substrate. It will be observed that in the present process, a layer of Ta oxide is inevitably transferred along with the film structure of interest and is present as a top layer on the transferred structure. For many optical structures, this Ta oxide layer can be incorporated advantageously within the design of the structure. Optical structures typically comprise a stack of alternating layers of a low refractive index dielectric material and a high refractive index dielectric material or alternating dielectric and thin metal layers. The dielectric layers in such structures usually have an optical thickness i.e. actual thickness multiplied by index of refraction, which is close to a multiple of $\frac{1}{8}$ the wavelength of light for which the structure is designed i.e. L/2, L or 2L, H/2, H or 2H, where L and H denote a quarterwave optical thickness of low and high index layers respectively. Exemplary dielectric combinations are zinc sulfide (index n=2.36) with magnesium fluoride (n=1.38) and titanium dioxide (n=2.2-2.7 depending on structure) with silicon dioxide (n=1.46), although a variety of other dielectric materials are also used. Examples of such materials and layer designs for applications such as anti-reflective coatings, filters, polarizers and others are given in the monograph 'Thin Film Optical Filters' by A. Macleod, Macmillan Publishing Co. 1986, the disclosure of which is incorporated herein by reference.

The present film release method is found to work effectively for Ta oxide layers obtained by anodizing at voltages of about 20 V and higher i.e. for an anodic film thickness greater than about 33 nm. The index of refraction of anodic Ta oxide is 2.22 so that an eighthwave thickness of this material at a design wavelength of 550 nm, i.e. in the middle of the visible spectrum, is 31 nm. Thus optical layers of interest greater than an eighthwave are readily accessible by the anodizing step of the present process. This together with the high index of anodic Ta allows the transferred anodic film to substitute for the high index layer in a design having such a layer as the outermost one. An important aspect of the anodizing process is that anodic film thickness can easily be controlled via the forming voltage to well within optical tolerances since each volt corresponds to only 1.7 nm of anodic film.

In situations where an outermost high index layer is not called for in the design, the Ta oxide layer can be made optically thick so as to be innocuous. Thus the present process is found to work effectively for anodizing voltages up to the breakdown voltage of anodic Ta oxide which is in excess of 300 V. The corresponding maximum accessible oxide film thickness is thus about 500 nm leading to an optical film thickness greater than two wavelengths in the middle of the visible spectrum. Alternatively, the anodic film thickness can be controlled to be precisely one wavelength in optical thickness at the design wavelength, so as to have no influence on the behaviour of the underlying structure. In these situations, and in others where the behaviour of the structure of interest is not sensitive to the presence of an additional outermost layer, the Ta oxide layer may be used as a protective layer.

Figure 3A:
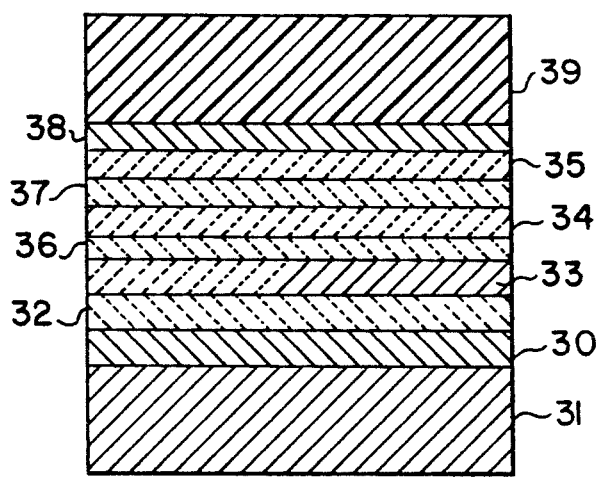
FIG. 3(A) and (B) show a structure suitable as a dielectric enhanced reflector before and after detachment from a metal substrate.
Figure 3B:
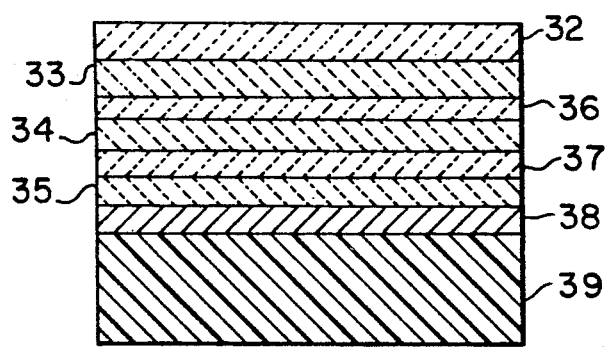
Figure 4:
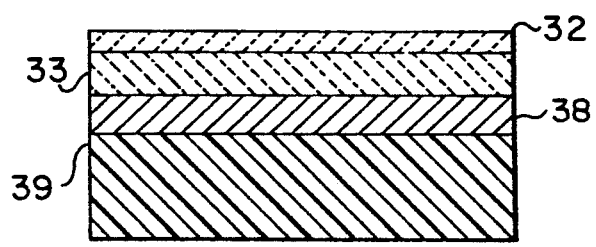
FIG. 4 shows a simplified dielectric enhanced reflector.

FIGS. 3 and 4 depict exemplary types of optical structures which act as enhanced reflectors based on the standard design Al(LH)$^n$ consisting of n alternating pairs of quarterwave dielectric layers with the first low index layer adjacent to an opaque Al reflector layer and a final high index layer.

FIG. 3(a) shows the structure just prior to detachment from the metal substrate and FIG. 3(b) shows the resulting inverted released structure. The structure is built up on a tantalum 30 coated Al foil 31 anodized (in the presence of F$^\ominus$) to 37.1 V to form a Ta$_2$O$_5$ anodic layer 32 having a thickness of 61.9 nm or a quarterwave at a design wavelength of 550 nm. The structure comprises alternating layers of SiO$_2$ 33, 34 and 35 and TiO$_2$ 36, 37 formed by RF or reactive sputtering or evaporation, and an outer Al layer 38 formed by sputtering or evaporation. A polyester substrate 39 is laminated to the top of the structure and the metal foil substrate 31 is peeled away. The resulting transfer-coated polyester shown in FIG. 3(b) exhibits enhanced reflectance in the middle of the visible spectrum compared to a similar polyester sheet metallized directly with Al alone.

FIG. 4 shows a minimal two layer enhanced reflector design produced in the same way. The reflector consists of a polyester substrate 39, an Al layer 38, an $SiO_2$ layer 33 and a $Ta_2O_5$ layer 32. Even in this minimal structure, the reflectance is increased to 96% compared with 92% for bare Al in the middle of the visible region.

Figure 5:
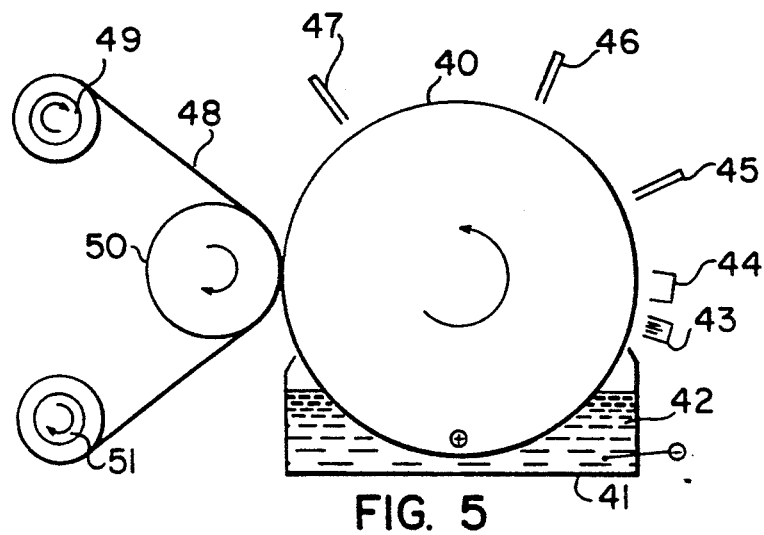
FIGS. 5 and 6 illustrate equipment suitable for operation of the process on a continuous basis.

The process of the present invention, when used on a commercial scale, can readily be adapted to continuous production, e.g. by using the apparatus as shown in FIG. 5. In this apparatus, a drum 40 made of valve metal is slowly rotated in the direction of the arrow. A bath 41 containing an electrolyte 42 (which includes an adhesion-reducing agent) is positioned so that the drum dips into the electrolyte and anodization is effected. A washing station 43 washes the drum as it emerges from the bath and a drying station 44 dries it. Sputtering or evaporation devices 45, 46, and 47 apply successive layers of desired material and then a heat sealable sheet 48, fed off a payoff roll 49, is pressed against the drum by a heated roller 50. The sheet 48 adheres to the film on the drum and the film transfers from the drum to the sheet. The coated sheet is then wound onto take-up roll 51.

Figure 6:
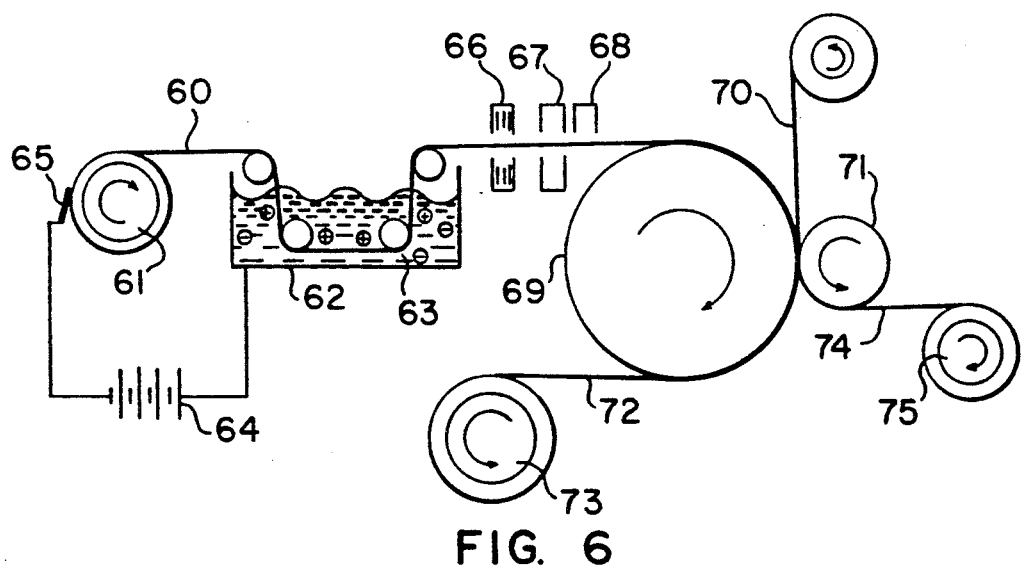

An alternative apparatus is shown in FIG. 6. In this apparatus an aluminum foil 60 having a tantalum coating is fed from a payout roll 61 through an electrolysis tank 62 containing an electrolyte 63 which is doped with a fluoride, e.g. Hf. Anodization of the foil takes place as the foil passes through the tank 62 by virtue of the anodization circuit which includes accumulator 64, sliding contact 65, the foil 60, the electrolyte 63 and the tank 62. As the anodized foil emerges from the tank it is washed at rinse station and dried at drying station 67. The foil is then provided with a layer of inorganic material at station 68 by an evaporation process, the layer being deposited on the Tabearing side of the foil. The coated foil passes around a heated drum 69 where it contacts a heat-sealable plastic substrate 70 in the nip formed between drum 69 and a counter drill roll 71. The coating film on the foil 60, which includes an anodic $Ta_2O_5$ layer and the layer of inorganic material, is transferred to the plastic substrate 70. The stripped foil is collected on take up roll 73 for re-use and the plastic substrate bearing the released film 74 is collected on take up roll 75.

What is claimed is:

1. A process for producing a released film made of a plurality of layers of material, at least one of which has been formed by a vapour deposition technique, said process comprising:
   providing a metal substrate made of a material selected from the group consisting of a value metal and an anodizable valve metal alloy, at least at an exposed surface thereof;
   subjecting said metal substrate to anodization at said exposed surface to form an anodic layer of an oxide of said value metal, said anodization being carried out in the presence of a fluoride as an adhesion-reducing agent in limited areas of said surface but in the absence of a fluoride in other remaining areas of said surface in order to make said layer readily detachable from said substrate in said limited areas but substantially undetachable in said remaining areas;
   coating said anodic layer with at least one layer of material by a vapour deposition process to form a partially releasable film of desired structure; and
   -detaching said releasable film from said metal substrate in said limited areas.

2. A process according to claim 1 wherein said anodization is carried out by temporarily masking said other remaining areas of said surface, carrying out a first anodization step in the presence of an electrolyte containing said adhesion-reducing agent, unmasking said other remaining areas and carrying out a second anodization step in the presence of an electrolyte containing substantially none of said adhesion-reducing agent.

3. A process according to claim 2 wherein said fluoride is contained in said electrolyte present during said first anodization step in an amount of at least 0.005% by volume of the electrolyte.

4. A process according to claim 1 wherein said valve metal is selected from the group consisting of Ta, Nb, Zr Hf and Ti.

5. A process according to claim 1 wherein said valve metal is selected from the group consisting of Ta and Nb.

6. A process according to claim 1 wherein said valve metal

7. A process according to claim 1 wherein said releasable film is detached from said metal substrate in said limited areas by a technique selected from the group consisting of scraping, abrasion and scratching.

8. A process according to claim 1 wherein said releasable film is detached from the metal substrate in said limited areas by attaching a flexible material to the release film and using said flexible material to peel said releasable film from said metal substrate.

9. A process according to claim 1 wherein said metal substrate is flexible and wherein said releasable film is detached from said metal substrate in said limited areas by attaching a material to said releasable film and peeling said metal substrate from said releasable film.

10. A process according to claim 1 wherein said releasable film is transferred to another substrate by attaching said other substrate to said releasable film prior to detaching said film from said metal substrate in said limited areas.

11. A process according to claim 10 wherein said other substrate is made of a material which is not suitable for coating by vapour deposition techniques.

12. A process according to claim 11 wherein said other substrate is selected from the group consisting of a low melting polymer, paper, textile and wood.

13. A process according to claim 10 wherein, following said transfer of said releasable film to said other substrate, said film is transferred from said other substrate to a third substrate.

14. A process according to claim 10 wherein, following said transfer of said releasable film to said other substrate, said other substrate is removed, leaving said released film free standing.

15. A process according to claim 14 wherein said other substrate is removed by a process selected from the group consisting of dissolving, oxidation and decomposition.

16. A process according to claim 10 wherein, following transfer of said releasable film to said other substrate, an exposed surface of said released film is coated with at least one layer of additional material.

17. A process according to claim 16 wherein said exposed surface is covered with a layer of metal by a method selected from the group consisting of sputtering, evaporation or electroless plating.

18. A process according to claim 1 wherein said anodic layer is coated with at least one layer of at least one material selected from the group consisting of oxides, nitrides, carbides and metals.

19. A process according to claim 1 wherein said anodic layer is coated with said at least one layer by a procedure selected from the group consisting of sputtering, vacuum evaporation and chemical vapour deposition.

20. A process according to claim 1 wherein said anodic film is coated with alternating layers of dielectric material of low and high refractive index and finally by a reflective metal layer in order to form, subsequent to said detachment step in said limited areas, a dielectric enhanced reflector.

21. A process according to claim 1 wherein said metal substrate comprises a layer of a valve metal coated on a different metal.

22. A process according to claim 21 wherein said layer of valve metal is at least 250 Å thick.

23. A process according to claim 21 wherein said different metal is a co-anodizable metal.

24. A process according to claim 23 wherein said co-anodizable metal is aluminum.

25. A process according to claim 1 carried out on a continuous basis, which comprises utilizing said metal substrate in the form of a rotating drum, and carrying out said anodizing, coating and detachment steps at successive positions around said drum.

26. A process for providing a coating containing at least one layer of vapour deposited material having a particular pattern on a substrate which is unsuitable for vapour deposition coating at least at a rapid rate, said process comprising:
    providing a metal substrate made of a material selected from the group consisting of a valve metal and an anodizable valve metal alloy, at least at an exposed surface thereof;
    subjecting said metal substrate to anodization at said exposed surface to form an anodic film of an oxide of said valve metal, said anodization being carried out in the presence of a fluoride as an adhesion-reducing agent in limited areas of said surface forming said desired pattern but in the absence of a fluoride in other remaining areas of said surface in order to make said film readily detachable from said metal substrate in said limited areas but substantially undetachable in said remaining areas;
    coating said anodic film with at lest one layer of inorganic material by a vapour deposition process to form a partially releasable film;
    attaching to said film said substrate which is unsuitable for vapour deposition coating; and
    detaching said releasable film from said metal substrate in said limited areas.

27. A process for forming an optical device made up of one or more layers of dielectric material and/or metal supported on a heat-sensitive substrate, said process comprising;
    providing a metal substrate made of a material selected form the group consisting of a value metal and an anodizable value metal alloy, at least at an exposed surface thereof;
    subjecting said metal substrate to anodization at said exposed surface to form an anodic film of an oxide of said value metal, said anodization being carried out in the presence of a fluoride as an adhesion-reducing agent in limited areas of said surface but in the absence of a fluoride in other remaining areas of said surface in order to make said film readily detachable from said metal substrate in said limited areas but substantially undetachable in said remaining areas;
    coating said anodic film with at least one layer of dielectric material or metal by a vapour deposition process to from a partially releasable film;
    attaching to said film said heat sensitive substrate; and
    detaching said releasable film from said metal substrate in said limited areas.

28. A released film comprising a layer of a value metal oxide and at least one layer of vapour deposited inorganic material, said released film having been produced by a process which comprises:
    providing a metal substrate made of a material selected from the group consisting of a value metal and an anodizable valve metal alloy, at least at an exposed surface thereof;
    subjecting said metal substrate to anodization at said exposed surface to form an anodic film of an oxide of said value metal, said anodization being carried out in the presence of a fluoride as an adhesion-reducing agent in limited areas of said surface but in the absence of a fluoride in other remaining areas of said surface in order to make said film readily detachable from said substrate in said limited areas but substantially undetachable in said remaining areas;
    coating said anodic film with at least one layer of inorganic material by a vapour deposition process to form a partially releasable film of desired structure; and
    detaching said releasable film from said metal substrate in said limited areas.

29. A substrate unsuitable for vapour deposition coating, at least at a rapid rate, having a coating thereon containing at least one layer of vapour deposited material having a particular pattern, said coated substrate having been produced by:
    providing a metal substrate made of a material selected from the group consisting of a valve metal and an anodizable valve metal alloy, at least at an exposed surface thereof;
    subjecting said metal substrate to anodization at said exposed surface to form an anodic film of an oxide of said valve metal, said anodization being carried out in the presence of a fluoride as an adhesion-reducing agent in limited areas of said surface forming said desired pattern but in the absence of a fluoride in other remaining areas of said surface in order to make said film readily detachable from said metal substrate in said limited areas but substantially undetachable in said remaining areas;
    coating said anodic film with at least one layer of inorganic material by a vapour deposition process to form a partially releasable film;
    attaching to said film said substrate which is unsuitable for vapour deposition coating; and
    detaching said releasable film from said metal substrate in said limited areas.

* * * * *